(12) United States Patent
Boujamaa et al.

(10) Patent No.: US 8,487,701 B2
(45) Date of Patent: Jul. 16, 2013

(54) CIRCUIT FOR AMPLIFYING A SIGNAL REPRESENTING A VARIATION IN RESISTANCE OF A VARIABLE RESISTANCE AND CORRESPONDING SENSOR

(75) Inventors: El Mehdi Boujamaa, Montpellier (FR); Pascal Nouet, Combaillaux (FR); Frederick Mailly, Montferrier-sur-Lez (FR); Laurent Latorre, Claret (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 0 days.

(21) Appl. No.: 13/002,594

(22) PCT Filed: Jul. 6, 2009

(86) PCT No.: PCT/FR2009/051324
§ 371 (c)(1),
(2), (4) Date: Jun. 10, 2011

(87) PCT Pub. No.: WO2010/001077
PCT Pub. Date: Jan. 7, 2010

(65) Prior Publication Data
US 2011/0248783 A1   Oct. 13, 2011

(30) Foreign Application Priority Data
Jul. 4, 2008   (FR) ..................................... 08 54585

(51) Int. Cl.
*H03F 3/04*   (2006.01)

(52) U.S. Cl.
USPC .......................................................... 330/288

(58) Field of Classification Search
USPC .................................................... 330/288, 290
See application file for complete search history.

(56) References Cited

U.S. PATENT DOCUMENTS

| | | | | |
|---|---|---|---|---|
| 4,439,745 A | * | 3/1984 | Nakayama ..................... | 330/296 |
| 4,605,907 A | * | 8/1986 | Rosenthal et al. ............. | 330/257 |
| 5,610,557 A | * | 3/1997 | Jett, Jr. ........................... | 330/261 |
| 6,177,785 B1 | * | 1/2001 | Lee ................................. | 323/281 |
| 2002/0053916 A1 | | 5/2002 | Tanizawa | |

FOREIGN PATENT DOCUMENTS

EP   0496147 A1   7/1992

OTHER PUBLICATIONS

Akiyama, O and Konno, H. 1994 "Integrated MR sensors for automobile" *IEE Transactions on Magnetics* 30(6):4617-4619.

\* cited by examiner

*Primary Examiner* — Steven J Mottola
(74) *Attorney, Agent, or Firm* — Knobbe, Martens, Olson & Bear, LLP

(57) ABSTRACT

A circuit for amplifying a signal representing a variation in resistance of a variable resistance comprising at least one first load linked to an output terminal of a first transistor whose other terminal is associated with a variable resistance, in such a way as to allow the recovery of the amplified signal at the terminals of the first load.

13 Claims, 7 Drawing Sheets

CIRCUIT FOR AMPLIFYING A SIGNAL REPRESENTING A VARIATION IN RESISTANCE OF A VARIABLE RESISTANCE AND CORRESPONDING SENSOR

RELATED APPLICATIONS

This application is a U.S. National Phase of International Application No.: PCT/FR2009/051324, filed Jul. 6, 2009, designating the U.S. and published on Jan. 7, 2010 as WO2010/001077A2, which claims the benefit of French Application No. 0854585, filed Jul. 4, 2008.

FIELD OF THE INVENTION

The present invention relates to a circuit for amplifying a signal representing a variation in resistance of a variable resistor.

It also relates to a sensor comprising such an amplification circuit.

More particularly, the invention relates to so-called resistive sensors, that is to say sensors comprising at least one variable resistor as the sensitive measuring element.

BACKGROUND OF THE INVENTION

During these last twenty years, the emergence of MEMS ("MicroElectroMechanical Systems") technologies has made it possible to integrate sensors within complex systems of small size. In fact it is now possible to envisage the monolithic integration of heterogeneous systems using standard CMOS technologies, comprising the sensitive part of the sensor and also the processing electronics thereof. The integration of the processing electronics as close as possible to the sensitive element thus allows an appreciable reduction in the manufacturing costs, while improving the performance of the sensors, in particular by way of appropriate processing of the noise.

Some of these sensors can thus be found in devices such as mobile telephones, GPSs, laptop computers, etc.

However, one major constraint when using sensors in these applications, which are generally battery-operated, is linked to the power consumption thereof. Due to this constraint, most of the sensors developed nowadays are based on capacitive transduction modes, thus limiting the power consumption but at the same time making the design of the sensitive element much more complex. This design complexity of the sensitive element is thus reflected in the final price of the product.

SUMMARY OF THE INVENTION

One of the ways to reduce the cost of a sensor is to use a transduction technology that makes it possible to reduce the structural complexity of the sensor. Resistive transduction provides a good solution to this problem, but the most frequently used signal conditioning structures still consume a lot of current.

The aim of the invention is to solve this problem.

More particularly, the invention aims to provide electronic structures which allow the conditioning of signals coming from resistive sensors, having performance levels that are comparable to sensors with capacitive transduction.

To this end, the invention relates to a circuit for amplifying a signal representing a variation in resistance of a variable resistor, characterized in that it comprises at least one first load connected to an output terminal of a first transistor, another terminal of which is associated with the variable resistor, so as to allow the recovery of the amplified signal at the terminals of the first load.

According to particular embodiments, the invention compFrises one or more of the following features, taken individually or in all technically possible combinations:
 the first transistor is a metal oxide semiconductor (MOS) field-effect transistor, the output terminal of which is the drain,
 the source of the first MOS transistor is connected to the variable resistor,
 the source of the first MOS transistor is connected to a reference resistor; and
 the gate of the first MOS transistor is connected to the gate and to the drain of a second MOS transistor, the source of the second MOS transistor being connected to the variable resistor and its drain being connected to a second load,
 the first transistor is a bipolar transistor, the output terminal of which is the collector,
 the emitter of the first bipolar transistor is connected to the variable resistor;
 the emitter of the first bipolar transistor is connected to a reference resistor; and
 the base of the first bipolar transistor is connected to the base and to the collector of a second bipolar transistor, the emitter of the second bipolar transistor being connected to the variable resistor and its collector being connected to a second load,
 the reference resistor is also a variable resistor,
 each of the first and second loads comprises at least one resistor,
 the resistors of the first and second load are variable resistors,
 each of the first and second loads comprises at least one transistor,
 each of the first and second loads comprises two transistors,
 the amplification circuit comprises a sampler or switch for sampling or switching the signal representing the variation in resistance, so as to reduce the low-frequency noise of the circuit,
 the sampler or switch is capable of correlated double sampling of the signal representing the variation in resistance,
 the amplification circuit comprises a modulator for modulating the amplitude of the signal representing the variation in resistance, so as to reduce the impact of the low-frequency noise of the transistors of said circuit, and
 the amplification circuit comprises a feedback stabilizer for stabilizing the bias point and the gain of said circuit.

The invention also relates to a circuit for amplifying a signal representing a variation in resistance of a variable resistor, characterized in that it comprises at least one first load connected to the drain of a first MOS field-effect transistor, the source of the first MOS transistor being connected to the drain of a third MOS transistor and its gate being connected directly to the gate and to the drain of a second MOS transistor, the source of the second MOS transistor being connected directly to the drain and to the gate of a fourth MOS transistor and its drain being connected to a second load, so as to allow the recovery of the amplified signal at the terminals of the first load.

The invention also relates to a circuit for amplifying a signal representing a variation in resistance of a variable resistor, characterized in that it comprises at least one first load connected to the collector of a first bipolar transistor, the emitter of the first bipolar transistor being connected to the collector of a third bipolar transistor and its base being connected directly to the base and to the collector of a second bipolar transistor, the emitter of the second bipolar transistor being connected directly to the collector and to the base of a fourth bipolar transistor and its collector being connected to a second load, so as to allow the recovery of the amplified signal (14) at the terminals of the first load.

The invention also relates to a sensor, characterized in that it comprises an amplification circuit according to the above-defined features of the invention. According to one particular embodiment, the sensor is selected from the group comprising:
 a piezoresistive sensor;
 a pressure sensor;
 a temperature sensor;
 an acceleration sensor;
 an inclination sensor;
 a microphone; and
 a magnetic field sensor.

The invention thus makes it possible to overcome the disadvantages of the usual circuits for conditioning the signals coming from resistive sensors, by making it possible to reduce the current consumption of these circuits while ensuring an acceptable output signal level and a non-degraded bandwidth.

The invention thus makes it possible to use resistive sensors integrated within complex systems of small size, instead of capacitive sensors which are more complex to manufacture and more expensive.

BRIEF DESCRIPTION OF THE DRAWINGS

Embodiments of the invention will now be described in a more precise but non-limiting manner with reference to the appended drawings, in which.

DETAILED DESCRIPTION OF THE PREFERRED EMBODIMENT

By definition, a resistive sensor converts the measurand (physical quantity to be measured) into a variation in resistance. The rest of the description will concentrate on piezoresistive sensors, which form a sub-set of the resistive sensors in which the measurand causes a mechanical deformation of a test body which gives rise to a stress and then to a variation in resistance. The transduction is achieved by virtue of so-called strain gauges which can be manufactured using materials that have piezoresistive properties. From a "system" point of view, these gauges are resistors, the value of which is to be measured using a conditioning or bias and measuring circuit.

Figure 1:
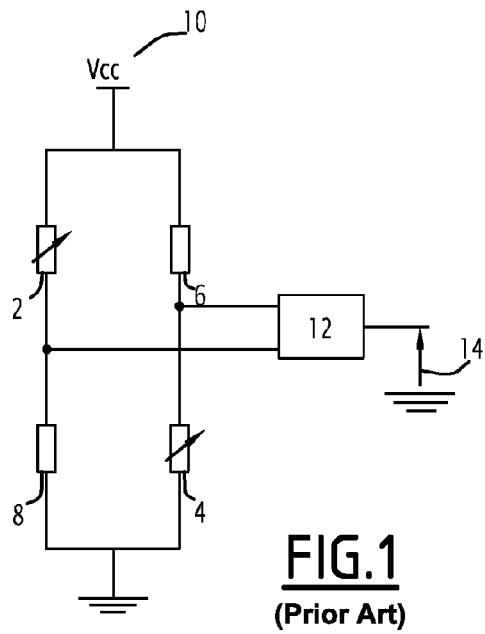
FIG. 1 is a schematic diagram showing the structure of an amplification circuit of the prior art.

FIG. 1 shows the most commonly used piezoresistive sensor conditioning structure.

In this FIG. 1, the measuring sensor is a piezoresistive sensor comprising two variable resistors 2 and 4 of the same mean value R and a circuit for amplifying the signal representing the variation ΔR in the resistors 2 and 4. This circuit consists of a Wheatstone bridge formed of the variable resistors 2 and 4 and of two reference resistors 6 and 8, the resistance values of which are equal to R. The Wheatstone bridge thus formed is supplied by a $V_{CC}$ voltage generator 10.

In one particular embodiment, the Wheatstone bridge comprises a low-noise amplifier 12 making it possible to amplify the amplitude of the output signal coming from the Wheatstone bridge, so as to obtain an amplified output signal 14.

The low-noise amplifier 12 is particularly used in applications using sensors of the MEMS type with low sensitivity.

The significant disadvantage of the Wheatstone bridge shown in FIG. 1 is the power consumption thereof. In fact, the current consumed by the Wheatstone bridge is $V_{CC}/R$ with a value of R that is in general equal to a few kiloohms. The current consumed intrinsically by the bridge is therefore a few milliamperes, thus making it possible to use such a device in portable applications for which power dissipation is a critical point. One of the ways to reduce the consumption of the Wheatstone bridge is to use resistors of greater value, thus bringing about a reduction in the intrinsic resolution of the sensor. This is because the intrinsic noise generated by a resistor is directly proportional to the square root of its value. This becomes problematic in applications with a very low sensitivity, where the useful signal delivered by the sensor is very close to the intrinsic noise of the sensitive element.

Another way to reduce the consumption of the resistive bridge is to supply it with power only for a certain period of time. The mean value of the current consumed is thus proportional to the ratio of the time during which the bridge is supplied with power to the time during which it is not supplied with power (duty factor of the supply voltage of the Wheatstone bridge). However, this action has the effect of degrading the bandwidth of the sensor. Since the output signal can be read only during the phase in which power is supplied to the bridge, the maximum frequency of the sampled system is then the Nyquist frequency divided by two.

Figure 2:
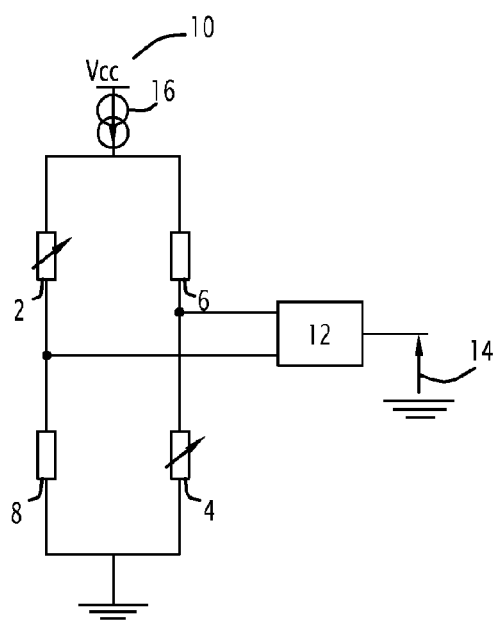
FIG. 2 is a schematic diagram showing a variant of the structure of the amplification circuit of FIG. 1.

FIG. 2 shows a variant of the structure of the circuit of FIG. 1, in which the Wheatstone bridge is supplied by an $I_{BIAS}$ current generator 16 instead of the $V_{CC}$ voltage generator 10.

The current consumed by the Wheatstone bridge is then $I_{BIAS}$ instead of $V_{CC}/R$ for a voltage-supplied Wheatstone bridge. Consequently, by setting a low current value, the overall power dissipation is greatly reduced. The disadvantage of this type of bias is the output level of the signal. This is because the output signal of the Wheatstone bridge is directly proportional to the current passing through the sensitive resistors 2 and 4. Therefore, by reducing this current, the level of the output signal 14 is reduced.

The invention makes it possible to solve the problems of the conditioning circuits of FIGS. 1 and 2 based on the use of a passive Wheatstone bridge composed only of resistors by proposing an amplification circuit which consumes a low current while guaranteeing an acceptable output signal level and a non-degraded bandwidth.

Various embodiments of the amplification circuit according to the invention are described in the rest of the description with reference to FIGS. 3 to 10.

Figure 3:
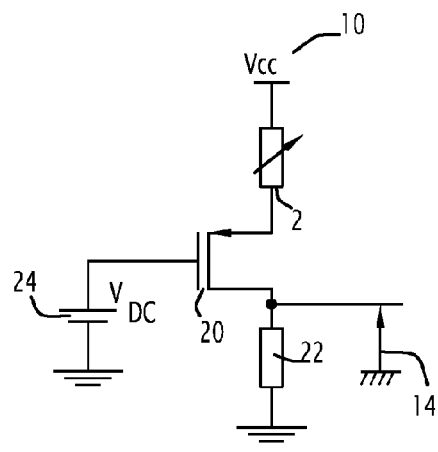
FIG. 3 is a schematic diagram showing the structure of an amplification circuit according to a first embodiment of the invention.

FIG. 3 shows a first embodiment of such a circuit.

The circuit shown in FIG. 3 comprises a P-MOS field-effect transistor 20, the source of which is connected to the variable resistor 2 representing the sensitive element of the resistive sensor, the signal of which is to be recovered. The drain of the transistor 20 is connected to a load consisting of a reference resistor $R_1$ denoted by the reference 22, at the terminals of which the amplified signal 14 is recovered. The gate of the transistor 20 is connected to a $V_{DC}$ direct voltage generator 24.

The variation $\Delta R$ in the variable resistor 2 causes a variation in voltage on the source of the transistor 20, thus allowing a modulation of the gate-source voltage $V_{GS}$ around an operating point.

The current consumed by the circuit of FIG. 3 is around a hundred microamperes for a resistance value of the variable resistor 2 equal to 1 k$\Omega$. The current consumption of this circuit is therefore much lower than those of the conventional Wheatstone bridge structures of FIGS. 1 and 2. The higher the mean value of the variable resistor 2, the further the current consumption will be reduced.

Figure 4:
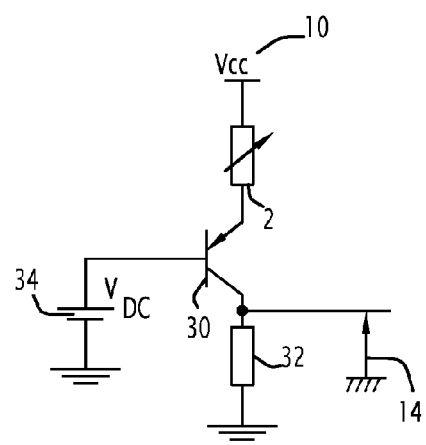
FIG. 4 is a schematic diagram showing the structure of an amplification circuit according to a second embodiment of the invention.

FIG. 4 shows a second embodiment of the circuit according to the invention.

The circuit shown in FIG. 4 comprises a PNP bipolar transistor 30, the emitter of which is connected to the variable resistor 2.

The collector of the transistor 30 is connected to a load consisting of a reference resistor $R_1$ denoted by the reference 32, at the terminals of which the amplified signal 14 is recovered.

The base of the transistor 30 is connected to a $V_{DC}$ direct voltage generator 34.

The variation $\Delta R$ of the variable resistor 2 causes a variation in voltage on the emitter of the transistor 30, thus allowing a modulation of the base-emitter voltage $V_{BE}$ around an operating point.

The structures of FIGS. 3 and 4 are equivalents in terms of operation. Consequently, the embodiments described in the rest of the description concern circuits using MOS transistors, but they can be reproduced using bipolar transistors by making the analogy between the MOS transistor and the bipolar transistor in which the source is equivalent to the emitter, the drain is equivalent to the collector and the gate is equivalent to the base.

Furthermore, although the circuits described use PMOS (PNP) transistors, other embodiments (not shown) use NMOS (NPN) dual structures.

The structures proposed in the embodiments of FIGS. 3 and 4 present a problem which is the rejection of the influencing quantities. This is because the piezoresistive sensor may be used in fairly constricted environments (temperature, humidity, etc.), possibly leading to a variation in resistance of the sensitive elements which is not due to the variation in the physical quantity that it is desired to measure. Thus an increase in the temperature, for example, may bring about a variation in the output voltage 14 of the circuits of FIGS. 3 and 4.

In order to solve this problem, the embodiments described with reference to FIGS. 5 to 10 correspond to declinations of the structure of FIG. 3 for the use thereof in differential mode.

The Ibias current generator 16 shown in these FIGS. 5 to 11 is optional and is not indispensable for the operation of the circuits of these figures.

Figure 5:
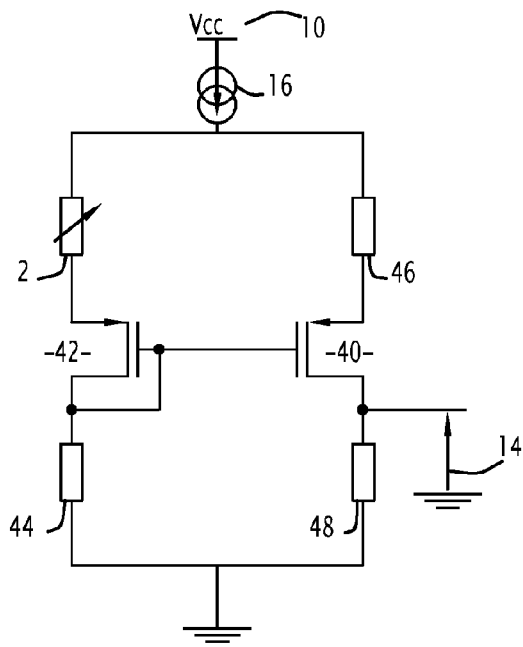
FIG. 5 is a schematic diagram showing the structure of an amplification circuit according to a third embodiment of the invention.

FIG. 5 shows an amplification circuit operating in differential mode. This circuit comprises a first MOS transistor 40, the gate of which is connected to the gate and to the drain of a second MOS transistor 42.

The source of the second transistor 42 is connected to the variable resistor 2, and its drain is connected to a load consisting of a resistor 44.

The source of the first transistor 40 is connected to a reference resistor 46, and its drain is connected to a load consisting of a resistor 48 that may be selected to be of the same resistance as the resistor 44. The output voltage 14 corresponding to the amplified signal is recovered at the terminals of the load formed by the resistor 48.

The benefit of this embodiment lies in the fact that, in the absence of a useful signal, if an influencing quantity exists, this will have an identical impact on the variable resistor 2 and the reference resistor 46, and the output voltage of the assembly will not vary.

Figure 6:
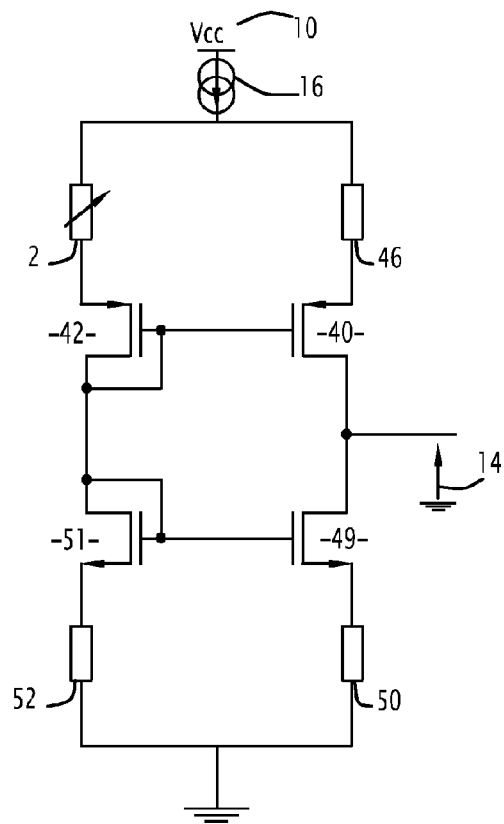
FIG. 6 is a schematic diagram showing the structure of an amplification circuit according to a fourth embodiment of the invention.

FIG. 6 shows a variant of the embodiment of FIG. 5, in which the first load connected to the drain of the MOS transistor 40 consists of a MOS transistor 49 in series with a resistor 50, and the second load connected to the drain of the MOS transistor 42 consists of a MOS transistor 51 in series with a resistor 52.

According to one particular embodiment, the resistors 46, 50 and 52 have the same resistance. Such an assembly makes it possible to obtain a gain that is much greater than that of the assembly of FIG. 5.

Figure 7:
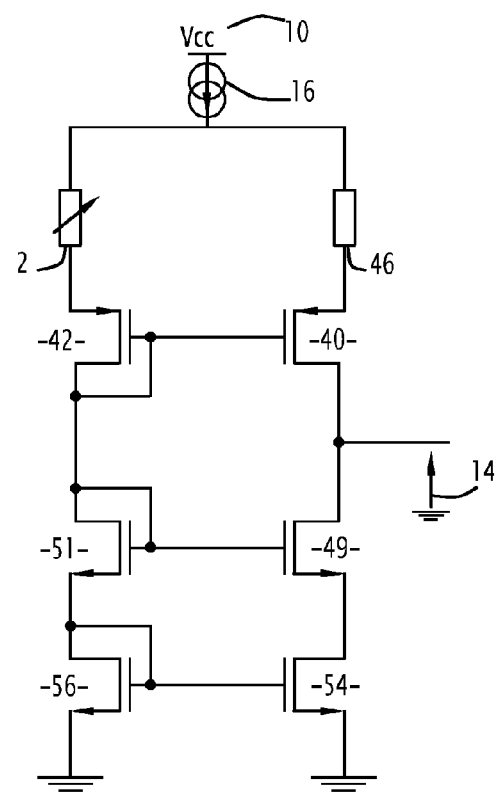
FIG. 7 is a schematic diagram showing the structure of an amplification circuit according to a fifth embodiment of the invention.

FIG. 7 shows a variant of the embodiment of FIG. 6, in which the resistors 50 and 52 are replaced respectively by MOS transistors 54 and 56 forming a current mirror.

Figure 8:
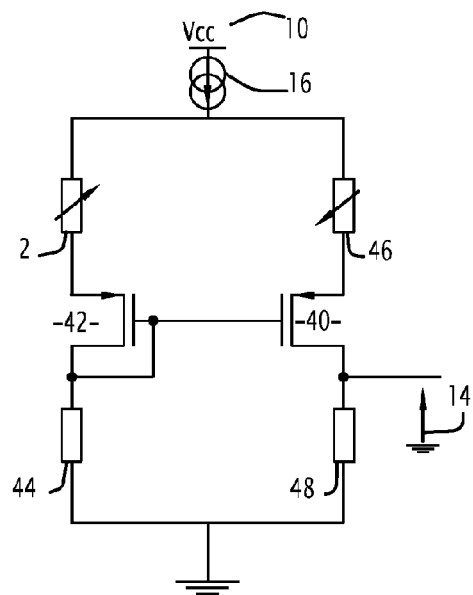
FIG. 8 is a schematic diagram showing the structure of an amplification circuit according to a sixth embodiment of the invention.
Figure 9:
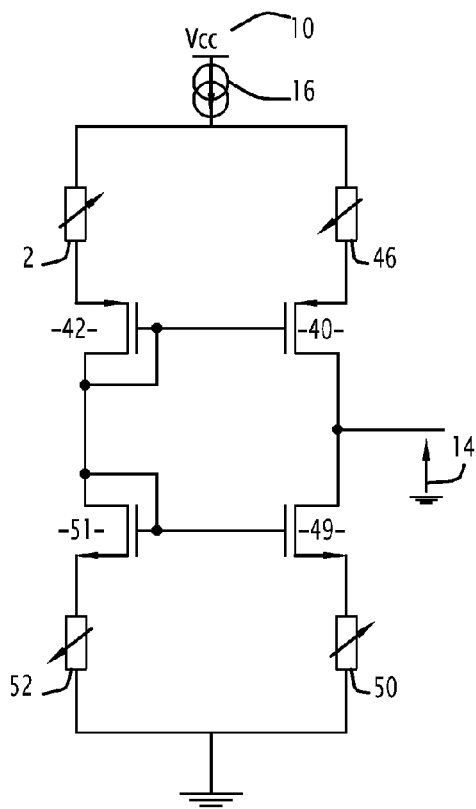
FIG. 9 is a schematic diagram showing the structure of an amplification circuit according to a seventh embodiment of the invention.

The embodiments shown with reference to FIGS. 8 and 9 correspond respectively to those of FIGS. 5 and 6, in which the reference resistor 46 is a variable resistor of mean value R. By way of example, in the case of an inclinometer having two sensitive resistances $R+\Delta R$ and $R-\Delta R$, the resistor 2 is $R+\Delta R$ and the reference resistor 46 is $R-\Delta R$.

According to the embodiment shown in FIG. 9, the resistors 50 and 52 of the loads are also variable. By way of example, the resistor 52 is $R-\Delta R$ and the resistor 50 is $R+\Delta R$.

The circuits of FIGS. 8 and 9 have the advantage of multiplying the gain by the number of sensitive elements (variable resistors) present in the circuit.

Figure 10:
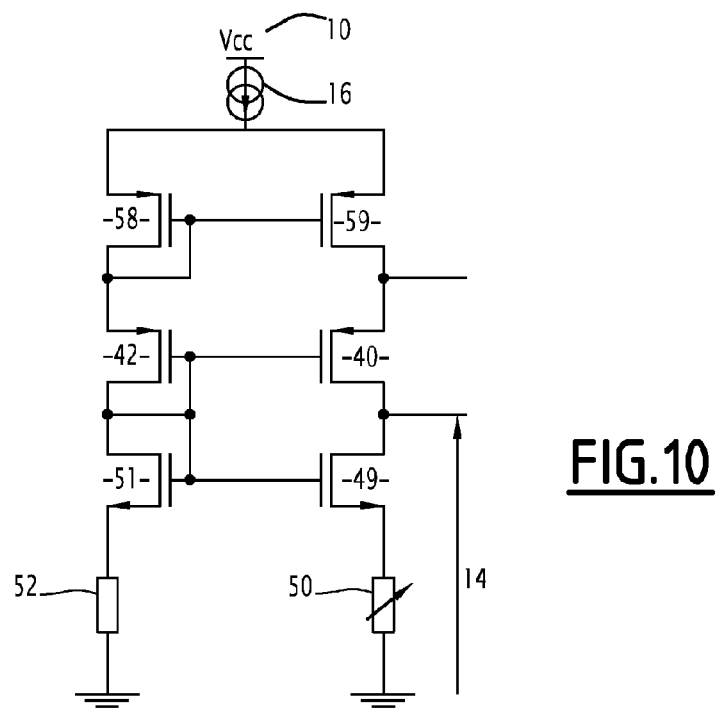
FIG. 10 is a schematic diagram showing the structure of an amplification circuit according to an eighth embodiment of the invention.

FIG. 10 shows a variant of the circuit of FIG. 9, in which the resistor 52 is constant and the variable resistors 2 and 46 are replaced respectively by two MOS transistors 58 and 59.

The circuits according to the invention described with reference to FIGS. 3 to 9 make it possible to reduce the current consumption of the sensor by a factor of at least 35 in comparison to the conventional circuit of FIG. 1, while preserving acceptable levels of performance in terms of resolution (noise) and gain.

These circuits can operate in a multitude of applications.

The main criteria making it possible to differentiate piezoresistive sensors are the sensitivity and the bandwidth. If the hypothesis is made of being in the presence of any given physical stimulus that is constant in terms of frequency amplitude, then a sensor with a high degree of sensitivity makes it possible to obtain a greater output signal, which translates to a better signal-to-noise ratio. If the signal-to-noise ratio is sufficiently high, the noise study on the various proposed circuits can be ignored. The proposed structures can thus be used without any major modification. Conversely, a sensor having a low sensitivity will produce a smaller output signal, and the noise study becomes indispensable. The noise level is proportional to the bandwidth, and the nature of the intrinsic noise of the electronics is different depending on the frequency bands studied. This is because the intrinsic noise of the electronics is distinguished by two separate types of noise: white noise which has a constant amplitude across the entire frequency band, and excess noise (called 1/f noise) which is inversely proportional to the frequency.

In low frequencies, therefore, it is necessary to provide means for reducing the 1/f noise in the proposed conditioning circuits.

The low-frequency devices may include a large number of applications and more particularly pressure or acceleration or inclination sensors. For these applications, it is then indispensable to use a modulator of the chopper-stabilized amplification type, or a modulator for modulating the current in the sensitive element for example, or a sampler of the correlated double sampling (CDS) type, so as to minimize the impact of the noise in the low frequencies. A first implementation of the sampler applied to the structure of FIG. 5 can be achieved by using the structure of FIG. 11.

Figure 11:
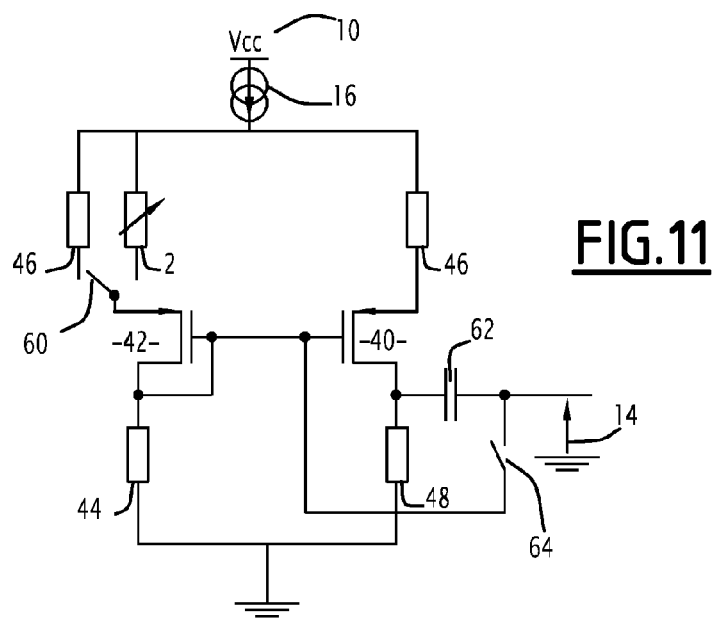
FIG. 11 is a schematic diagram showing the structure of an amplification circuit according to a ninth embodiment of the invention.

The circuit of the embodiment of FIG. 11 comprising a sampler or switch, making it possible to reduce the noise in the low frequencies. According to this embodiment, the source of the transistor 42 is connected to a switch 60 which is able to switch between the variable resistor 2 and the reference resistor 46.

The circuit also comprises a capacitor 62 connected to the drain of the transistor 40 and to a second switch 64 which is itself connected to the gate of the transistor 40.

According to one particular embodiment, the sampling used is a sampling of the correlated double sampling CDS type.

The principle of this sampling is based on the fact that, by taking quite a high sampling frequency, the 1/f noise is considered to be a direct voltage, that is to say an offset. By eliminating this offset, the 1/f noise is eliminated.

The circuit of FIG. 11 operates in two phases. In the first phase, the switch 60 is connected to the reference resistor 42 and the capacitor 62 is connected to the analog ground (bias point) of the circuit. In this phase, the offset voltage is thus read.

In the second phase, the switch 60 is connected to the variable resistor 2 and the offset voltage is eliminated, which greatly reduces the 1/f noise.

Nevertheless, there is a problem with regard to carrying out a sampling in the circuit of FIG. 11 when the gain of the circuit is high. This is because, when the gain of the circuit is high, the offset voltage will cause the circuit to become saturated.

One embodiment of the invention then consists in carrying out a CDS sampling at the input of the circuit of FIG. 6 by way of example.

Another embodiment of the invention, which makes it possible to reduce the impact of the 1/f noise of the transistors of the circuit, consists in carrying out a technique of modulating the amplitude of the signal representing the variation in resistance.

Figure 12:
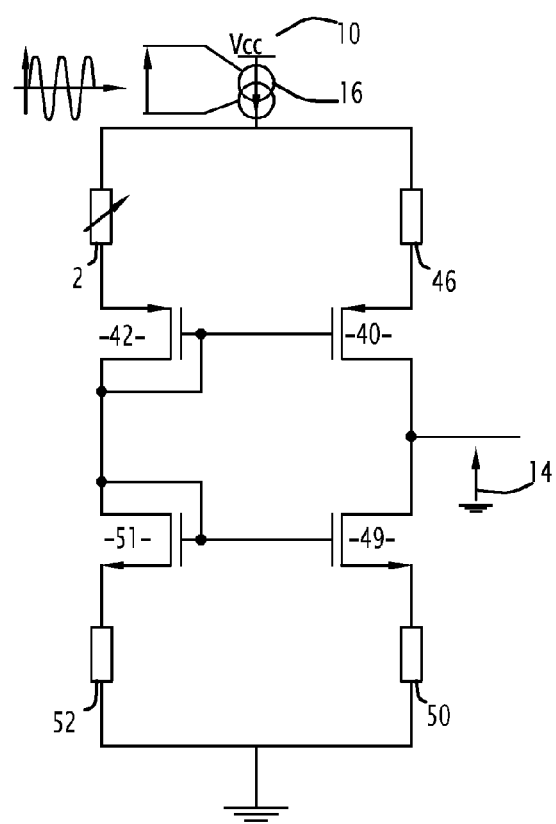
FIG. 12 is a schematic diagram showing the structure of an amplification circuit according to a tenth embodiment of the invention.

This embodiment is described with reference to FIG. 12, which shows the carrying-out of an amplitude modulation technique on the circuit of FIG. 6.

According to one embodiment, the constant current generator 16 is replaced by a sinusoidal current source. This has the effect of multiplying the sinusoidal current with the useful signal of the sensor, which allows an amplitude modulation. The spectrum of the useful signal is thus shifted into higher frequencies in which the 1/f noise becomes negligible.

Figure 13:
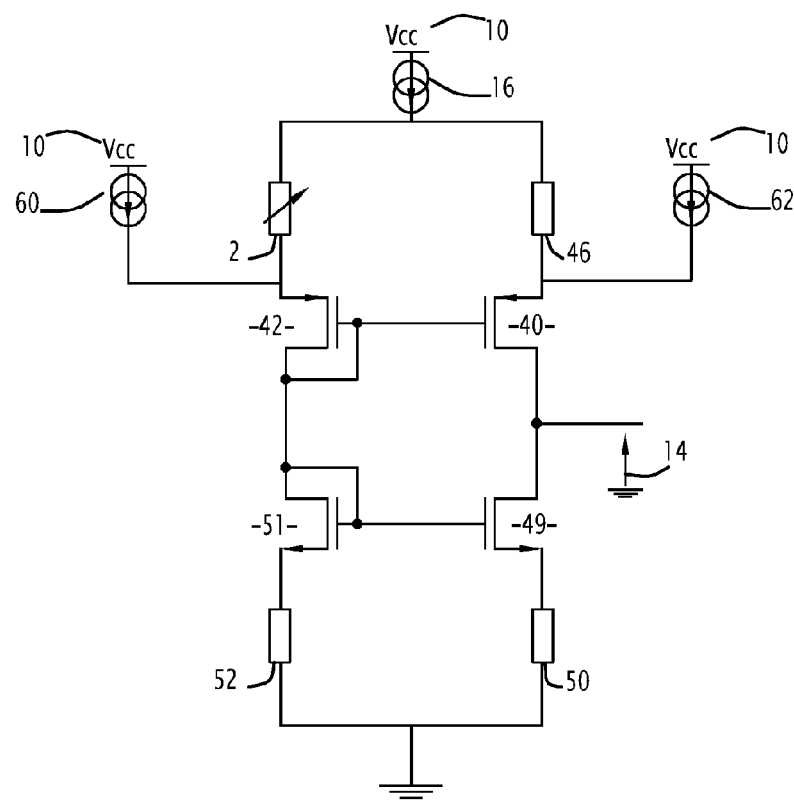
FIG. 13 is a schematic diagram showing the structure of an amplification circuit according to an eleventh embodiment of the invention.

FIG. 13 shows an embodiment of the invention in which the current generator 16 is replaced by two controllable current generators 60 and 62, respectively generating two currents $I_1$ and $I_2$ of low intensity. This circuit makes it possible to reduce the value of the equivalent voltage offset at the input by using a feedback system comprising weighted current generators.

The feedback circuit of FIG. 13 thus makes it possible to have a stable bias point and gain of the circuit.

Other variants of the feedback circuit of FIG. 13 can also be envisaged. By way of non-limiting examples, it is possible to use resistors or transistors instead of the current generators.

The invention thus allows an intrinsic reduction in the overall consumption of the conditioning circuits of resistive and piezoresistive sensors, enabling them to be used in a broader range of applications than at present.

The circuits of the various embodiments described with reference to FIGS. 3 to 13 can be used with different types of sensors in different frequency ranges, namely:

- narrow-band low-frequency sensors (0 Hz-100 Hz): temperature, pressure, inclination or (inertial) acceleration sensors;
- wide-band low-frequency sensors (100 Hz-4 kHz): audio applications (microphones); or
- narrow-band resonant sensors ($\geqq$20 kHz): magnetic field sensors.

In all these applications the invention makes it possible, in addition to reducing the current consumption of the circuits, also to increase the output signal level, thus improving the amplification of the sensor signal.

Of course, yet other embodiments can also be envisaged.

What is claimed is:

1. A circuit for amplifying a signal representing a variation in resistance of a variable resistor sensitive to a physical quantity to be measured comprising:
    at least a first load connected to an output terminal of a first transistor, an input terminal of the first transistor being connected directly to a reference resistor, and
    a second transistor having an input terminal connected directly to the variable resistor and an output terminal connected to a second load,
wherein the circuit is capable of recovering an amplified signal at the terminals of the first load, and wherein
    a control electrode of the first transistor is connected directly to both the control electrode and to the output electrode of the second transistor,
    the first load comprises a third transistor comprising an output electrode connected to the output electrode of the first transistor,
    the second load comprises a fourth transistor comprising an output electrode connected to the output electrode of the second transistor,
    a control electrode of the third transistor is connected directly to both a control electrode and to an output electrode of the fourth transistor, and an input electrode, respectively an output electrode, corresponding either to a source electrode, respectively a drain electrode, of a corresponding transistor for a metal oxide semiconductor (MOS) field effect transistor, or to an emitter electrode, respectively a collector electrode, of the corresponding transistor for a bipolar transistor.

2. A circuit according to claim 1, wherein the reference resistor is also a variable resistor.

3. A circuit according to claim 1, wherein each of the first and second loads comprise at least one resistor.

4. A circuit according to claim 3, wherein the resistors of the first and second loads are variable resistors.

5. A circuit according to claim 1, wherein each of the first and second loads comprises two transistors.

6. A circuit according to claim 1 comprising a sampler or a switch for sampling or switching the signal corresponding to the variation in resistance, so as to reduce a low-frequency noise of the circuit.

7. A circuit according to claim 6, wherein the sampler or switch is capable of correlated double sampling (CDS) of the signal corresponding to the variation in resistance.

8. A circuit according to claim 1 comprising a modulator for modulating the amplitude of the signal representing the variation in resistance, so as to reduce the impact of low-frequency noise of the transistors of said circuit.

9. A circuit according to claims 1 comprising a feedback stabilizer for stabilizing bias point and gain of said circuit.

10. A sensor comprising an amplification circuit according to Claim 1.

11. A sensor according to claim 10 selected from the group consisting of:
   a piezoresistive sensor;
   a pressure sensor;
   a temperature sensor;
   an acceleration sensor;
   an inclination sensor;
   a microphone; and
   a magnetic field sensor.

12. The circuit according to claim 1, wherein the first transistor and the second transistor are MOS field effect transistors or bipolar transistors.

13. A circuit according to claim 1, wherein the first, the second, the third and the fourth transistors are MOS field effect transistors or bipolar transistors.

* * * * *